United States Patent [19]

Hochschild et al.

[11] Patent Number: 4,862,121

[45] Date of Patent: Aug. 29, 1989

[54] SWITCHED CAPACITOR FILTER

[75] Inventors: James R. Hochschild, Plano; William A. Severin, Allen, both of Tex.

[73] Assignee: Texas Instruments Incorporated, Dallas, Tex.

[21] Appl. No.: 85,054

[22] Filed: Aug. 13, 1987

[51] Int. Cl.⁴ .......................................... H03H 11/12
[52] U.S. Cl. .................................. 333/173; 333/19; 330/107
[58] Field of Search ................ 333/173, 214, 216, 19; 330/51, 107, 109

[56] References Cited

U.S. PATENT DOCUMENTS 4,559,498 12/1985 Sokoloff ........................... 333/173 X
4,633,425 12/1986 Senderowicz .................... 333/173 X
4,647,865 3/1987 Westwick ......................... 333/173 X

FOREIGN PATENT DOCUMENTS 120213 9/1980 Japan ................................... 333/173

OTHER PUBLICATIONS

Gregorian, Roubik; "Switched-Capacitor Filter Design Using Coecaded Sections"; *IEEE Trans on Circuits and Systems;* vol. CAS-27, No. 6; Jun. 1980; pp. 515–521.

Laker, K. R. et al.; "Design & Implementation of Cascaded Switched Capacitor Delay Equalizers"; *IEEE Trans on Circuits & Systems;* vol. CAS32, No. 7; Jul. 1985; pp. 700–711.

Primary Examiner—Eugene R. LaRoche
Assistant Examiner—Benny Lee
Attorney, Agent, or Firm—Michael E. Melton; Leo N. Heiting; Melvin Sharp

[57] ABSTRACT

A biquadrature switched capacitor filter having differential input/output integrator amplifiers (12,34) and switched capacitor networks (16,28,36,40). The differential outputs of one amplifier (12) are crossed and connected to the switched capacitor networks (36,40) of the other amplifier (34) to provide a negative capacitance effect. Feedforward capacitors (70,72) are switched to prevent the stage input signals (IN+, IN−) from being coupled during certain phases of a biphase nonoverlapping clock. In high-pass applications, a feedback capacitor (134, 136) makes positioning of pole and zero responses easy. Amplifier bandwidth is controlled by switched capacitors (148, 152) connected to the amplifiers during certain clock phases.

27 Claims, 1 Drawing Sheet

SWITCHED CAPACITOR FILTER

TECHNICAL FIELD OF THE INVENTION

The present invention relates in general to electrical filter circuits, and more particularly relates to switched capacitor filters.

BACKGROUND OF THE INVENTION

Electrical filters find a wide variety of applications in analog circuits for selectively enhancing or suppressing certain frequencies. Low-pass filters are effective to pass low frequencies while suppressing high frequencies, while high-pass filters are adapted for passing high frequencies while suppressing lower frequencies. Notch-type filters function to suppress a very narrow band of frequencies, while passing frequencies on each side thereof. Equalization filters are effective to process groups of frequencies with different delays for each such group.

Filters can be constructed according to transfer functions which are representative of the noted low-pass, high-pass, notch or equalization characteristics. Filters have been conventionally constructed using discrete resistors, capacitors and inductors. Switched capacitor filters have more recently received favorable attention, in that such filters provide a practical approach for realizing precision filters in a monolithic form. Disclosed in U.S. Pat. No. 4,571,731 by Klinkovsky et al., is such a switched capacitor filter. The MOS LSI technology is particularly well adapted for the integration of switched capacitor filters. Essentially, a switched capacitor implementation of a filter is achieved by replacing each resistor critical to the transfer function with a capacitor and one or more switches, and connecting such an arrangement to an integrating amplifier. The capacitors can be constructed in an array using double-level polycrystalline techniques. The capacitors can then be connected together to form capacitances of desired value, and MOS switches can be utilized for switching such capacitors.

From the foregoing, a switched capacitor filter can be fabricated in a small wafer area by utilizing capacitors, transistor switches and high-performance operational amplifiers. Moreover, the transfer function of a switched capacitor filter depends only on the ratio of the various capacitors, and thus by changing the value of certain capacitors, different transfer functions can be obtained. Also required of a switched capacitor filter are a pair of clock signals which are biphase in nature, and nonoverlapping. As a result, certain capacitors can be charged and discharged so as to transfer a net charge during one clock period, and thereby define an average current flow likened to that flowing through a resistor. When the clock frequency is high with respect to the input analog signal frequency, the effects of sampling can be ignored, and thus the effective value of a resistor is proportional to the inverse of the frequency times the capacitance value.

A biquadratic switched capacitor filter can be implemented utilizing a two integrator loop topology, e.g., a pair of complementary integrators. A versatile biquadratic transfer function can take the form of $$V_O(z)/V_i(z) = k(z^2 + az + b) \div (z^2 + cz + d).$$

Of course, the zeros of the transfer function are representative of the numerator of the equation, while the poles are represented by the denominator.

While switched capacitor filters have provided an excellent technique for implementing electrical filters using silicon integrated circuit technology, certain limitations hamper the optimal utilization thereof. For example, in cascading a number of biquadratic filter stages together, the time required for each such stage to settle is cumulative, thereby requiring a lower sampling rate, or a lower clock rate for switching the capacitors. As a practical matter, cascading 2–3 stages represents a present limitation. Also, there is currently no economical or practical technique for realizing negative capacitor values which can be encountered in the solution to various transfer functions. Hence, the full utilization of switched capacitor filters is often not realized.

An additional shortcoming of switched capacitor filters, in many instances, is the uneven capacitive loading of the biquadratic filter circuits during each clock phase. With such uneven capacitive loading, the bandwidth of each operational amplifier is different, or larger than required, thereby contributing to the noise factor of the filters. From the foregoing, it can be seen that a need exists for further improvements in biquadratic switched capacitor filters to more fully realize their capabilities.

SUMMARY OF THE INVENTION

In accordance with the present invention, the disclosed biquadratic switched capacitor filter method and apparatus substantially reduces or eliminates the disadvantages and shortcomings associated with the prior art techniques. According to the invention, many biquadratic filter stages can be cascaded together by switching a feedforward capacitor, characteristic to each stage, with a transistor switch. In this manner, the stages are decoupled, thereby permitting the individual settling of each stage during one clock phase. With all stages of a multistage switched capacitor filter being able to settle during one clock phase, many stages can be cascaded together without the adverse affects heretofore experienced.

Functioning in cooperation with the switched feedforward capacitors are differential input/output operational integrator amplifiers which implement a mirrored pole-zero pair characteristic of a delay equalization filter. With differential outputs, the connection between one integrator amplifier and the other within each stage can be cross-coupled to provide a convenient and efficient inversion. During one clock phase, one stage can then sample the analog signal for filtering, while the other stage can settle, and vice versa for the next clock phase.

In addition to providing the alternate settling and sampling of each stage in different clock cycles, the cross-coupling between operational integrator amplifiers of each stage also provides a circuit implementation for realizing negative capacitor values. By economically achieving a circuit which implements negative capacitor values, many more filter functions can be realized.

In accordance with another feature of the invention, the capacitive loading of the operational integrator amplifiers of each stage are analyzed, and corrected if a loading imbalance is noted. If an amplifier of one of the stages drives significantly different capacitive loads during the two clock phases, then the output of such amplifier is provided with an additional capacitance which is switched during the proper phase so as to correct the imbalance.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts or elements throughout the views, and in which.

DETAILED DESCRIPTION OF THE INVENTION

Figure 1:
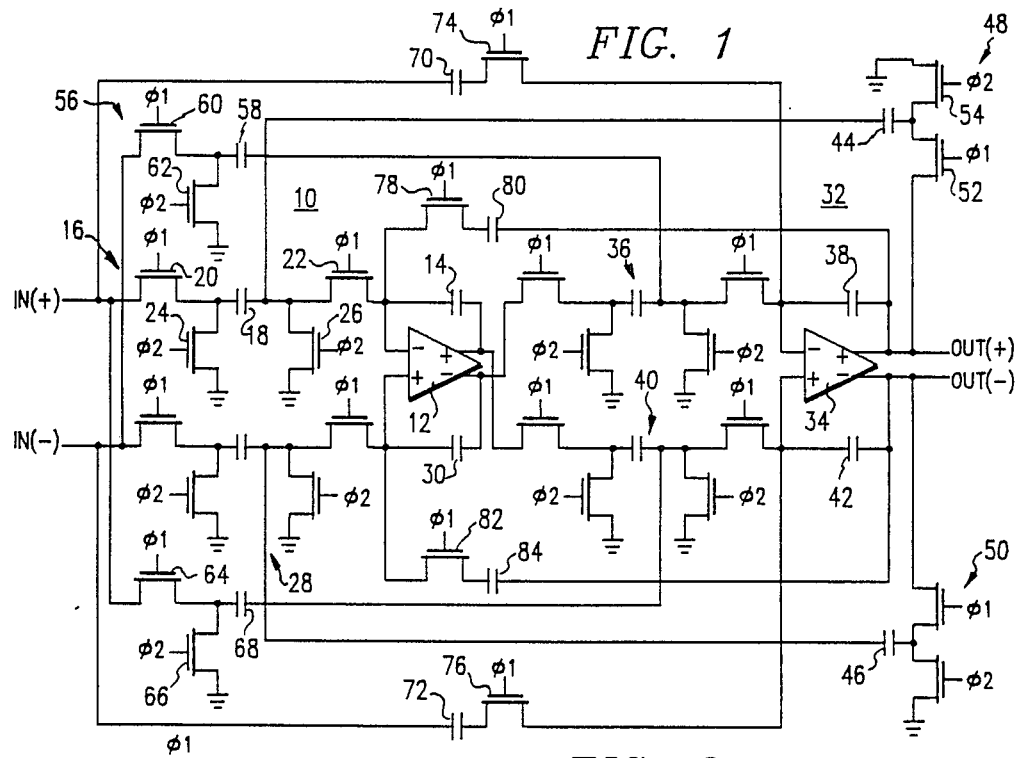
FIG. 1 is an electrical schematic drawing of an equalizer filter embodying the principles and concepts of the invention.

With reference to FIG. 1, there is illustrated a biquadratic switched capacitor equalizer filter stage constructed in accordance with the invention. The topology of the noted equalizer is characterized by a biquadratic transfer function and a circuit which is insensitive to stray or parasitic capacitances. The illustrated topology also exhibits sufficient degrees of freedom to realize a number of transfer functions. In the preferred embodiment of the invention, the switched capacitor filters are employed in analog interface circuits for processing input signals having analog characteristics and for conversion into digital signals. Such circuits may also include A/D converters as well as D/A converters for converting digital signals back to analog signals.

The equalizer filter of FIG. 1 includes a first integrator 10 comprising a differential input/output operational amplifier 12 with a feedback capacitor 14 and a switched capacitor input network 16. A switched capacitor 18 couples analog currents from a stage input IN(+) to the inverting input of the amplifier 12, via a number of MOS transistor switches functioning to provide a switched capacitor. Particularly, during the first phase $\phi 1$ of a biphase nonoverlapping clock, a pair of series transistor switches 20 and 22 close and capacitive couple a sample of the input signal currents to the inverting input of amplifier 12. During the second phase $\phi 2$ of the nonoverlapping clock, parallel transistors 24 and 26, connected on each side of the capacitor 18, conduct and connect each terminal of the capacitor 18 to ground, thereby discharging the capacitor. It should be noted that due to the nonoverlapping nature of the clock phases $\phi 1$ and $\phi 2$, the transistor switch pairs 20, 22 and 24, 26 are never driven into conduction at the same time. Hence, during one phase $\phi 1$, the capacitor is connected between the stage input IN(+) of the equalizer filter and the inverting input of the integrator amplifier 12. During the other phase $\phi 2$, both sides of the capacitor 18 are grounded. There is a dead time between the transition from $\phi 1$ and $\phi 2$, and between the transition from $\phi 2$ to $\phi 1$, where all transistor switches 20, 22, 24 and 26 are nonconducting, thereby providing a guard time for assuring the nonoverlapping operation of transistor switch pairs 20, 22 and 24, 26. When the clock frequency of $\phi 1$, $\phi 2$ is high with respect to the frequency of the analog signal appearing on the stage input IN(+), the effects of sampling of the input signal can be ignored. With such a condition, an effective resistance of $1/fc_{18}$ is connected between the stage input IN(+) and the inverting input of the integrator amplifier 12.

The noninverting input of integrator amplifier 12 is comparably connected by switched capacitor network 28 to a stage input IN(−) of the equalizer filter. The stage inputs IN(+) and IN(−) are differential inputs to the equalizer filter stage. A feedback capacitor 30 is connected between the noninverting input and inverting output of the integrator amplifier 12 to provide an integrator function in conjunction with the capacitor 19 of the switched capacitor network 28. The integrating function depends on the ratio of the capacitance of the switched capacitor capacitance and that of the feedback capacitor connected between the respective input and output of the integrator amplifier 12.

Typically, the operational amplifier 12 is a high gain amplifier having a high input impedance and a low output impedance. The MOS transistor switches are characterized by low channel resistances so as to reduce the time constants for charging and discharging the switched capacitors. For providing equalizer functions according to a desired transfer function, the capacitors associated with each switched capacitor network 16 and 28 are of a unity value, while the feedback capacitors associated with the amplifier 12 are much larger. The integration of the equalizer filter of FIG. 1 into a silicon semiconductor wafer is accomplished by fabricating an array of capacitors, each having a substantially identical value, defined as a unity value. Most other capacitors of the equalizer filter comprise multiples of the unity value capacitor, and are constructed by connecting desired number of the capacitors of the array in parallel to achieve the desired capacitances. As a result, the equalizer filter of the invention is constructed having capacitors with no critical individual capacitance, but rather having capacitors with particular ratios with regard to each other, thereby rendering the components and thus the circuit operation less susceptible to parameter variations of the fabrication process.

The equalizer filter stage shown in FIG. 1 further includes a second integrator 32 comprising an operational amplifier 34, and a switched capacitor network 36 connected between the inverting input of integrator amplifier 34 and an output of integrator amplifier 12. The filter stage further includes a feedback capacitor 38 connected across the amplifier 34 for providing an integrating function. The integrator amplifier 34 is also of the differential input/output type, having mirrored circuits comprising a switched capacitor network 40 and a feedback capacitor 42. The differential output of the amplifier 34 constitutes the differential output of the filter stage, designated as OUT(+) and OUT(−). Unity value capacitors 44 and 46 are connected between the respective switched capacitor networks 16 and 28, via respective transistor switch pairs 48 and 50 to the differential outputs of the integrator amplifier 34. During the first phase of the nonoverlapping clock, the capacitor 44 is connected by transistor switch 52 to the filter stage OUT(+). During the $\phi 2$ timing period, transistor switch 54 conducts and grounds the capacitor 44, while transistor switch 52 is cutoff, thereby isolating OUT(+) from the capacitor 44. The transistor switch arrangement 50 functions in a comparable manner.

A switched capacitor arrangement 56 is effective to connect a unity value capacitor 58 between the filter stage input IN(−) and the switched capacitor network 36 associated with integrator amplifier 34. Particularly, during the first phase of the nonoverlapping clock, a series transistor 60 closes, thereby connecting the capacitor 58 between the noted points. During the second phase $\phi 2$, a parallel transistor 62 conducts, thereby grounding one terminal of the capacitor 58. Transistors 64 and 66 function in a comparable manner for connecting a unity value capacitor 68 between the filter stage input IN(+) and the switched capacitor network 40 associated with integrator amplifier 34. As noted above, the various capacitor values of the equalizer stage of FIG. 1 can be changed to move the poles and zeros to desired positions to achieve appropriate bandpass characteristics or group phase delays of the filter.

The equalizer filter stage further includes a feedforward capacitor 70 for coupling signals between the IN(+) input of the filter stage and the inverting input of the integrator amplifier 34. Feedforward capacitor 72 is comparably connected between the filter stage input IN(−) and the noninverting input of the integrator amplifier 34. A traditional shortcoming of the feedforward capacitors 70 and 72 in this type of switched capacitor filter is that when not switched, the capacitors 70 and 72 cause a settling problem when several similar filter stages are cascaded together. With feedforward capacitors 70 and 72 being unswitched, all stages of the cascaded arrangement must settle during one clock phase. This settling problem can become excessive when the capacitance ratio of feedforward capacitor 70 to feedback capacitor 38 is close to unity.

In accordance with an important feature of the invention, a transistor switch 74 has been provided in series with feedforward capacitor 70 to eliminate the continuous feedforward path through the stage. A similar transistor switch 76 has been added in series with feedforward capacitor 72 to selectively break the feedforward path associated therewith. Transistor switches 74 and 76 are driven during $\phi 1$ so that the feedforward paths associated with capacitors 70 and 72 are effective only during the phase $\phi 1$, but are interrupted during the phase $\phi 2$. While the capacitor switches 74 and 76 are effective to interrupt the feedforward paths, a situation results in which the previous filter stage, in a cascaded filter stage arrangement, is sampled during both clock phases. This is undesirable when utilizing switched capacitor filters. While rearranging the various phases by which the transistor switches are driven may provide a solution to a certain degree, various undesirable affects may still arise.

According to the invention, the switched capacitor equalizer filter is further optimized by utilizing the full differential capabilities provided by the differential input-output type amplifiers 12 and 34. To that end, the noninverting output of integrator amplifier 12 is connected to the switched capacitor network 40 which, in turn, is associated with the noninverting input of integrator amplifier 34. In like manner, the inverting output of integrator amplifier 12 is crossed, in that it is connected to the input of the switched capacitor network 36 which is associated with the inverting input of integrator amplifier 34. With this arrangement, it can be seen that during phase $\phi 1$, both integrator amplifiers 12 and 34 sample analog signals appearing at their respective inputs. Equalizer filter stages, if any, connected to the input and/or output of the illustrated equalization filter stage are driven by the biphase clocks such that such stages are decoupled from their respective inputs so that settling can occur during such cycle. On the next clock cycle, the stages reverse the noted sampling and settling functions. In other words, the equalizer filter stages connected to that illustrated in FIG. 1 have the clock phases connected thereto in a reversed manner.

In accordance with another feature of the switched capacitor equalizer filter of the invention, the crossed output of the differential amplifier 12 functions to provide an effective negative capacitance. This feature can be realized by those skilled in the art by analyzing the transfer function of the illustrated topology. With the availability of such a negative capacitance, and with many transfer functions requiring such an element, the use of differential amplifiers with the cross-coupled outputs provide an economical and efficient technique for realizing such negative value components.

An additional benefit of the equalizer filter of the invention is that the total capacitance which amplifier 34 must drive during either clock phase is significantly reduced. Indeed, an additional transistor switch 78 has been added in series with a feedback capacitor 80, between the noninverting output of integrator amplifier 34 and the inverting input of integrator amplifier 12. The transistor switch 78 is gated by phase $\phi 1$ to provide a feedback from amplifier 34 back to amplifier 12 and provide a smaller capacitive load. This feature further improves the settling time of the circuits and also relaxes the drive requirements of such integrator amplifiers. Transistor switch 82 and feedback capacitor 84 provide a similar function, when connected between the inverting output of integrator amplifier 34 and the noninverting input of amplifier 12.

The technical advantage of the equalizer filter of the invention is that with switched feedforward capacitors, many such stages can be connected together to provide an overall group delay response with very little variation. Indeed, by coupling a number of such equalization filters together, a flat response from, for example, 600 hZ–3 khZ can be had to within + or −50 microseconds delay. In practice, three such filter stages can achieve this highly precise equalization function. The switched feedforward capacitors, together with the cross-coupled outputs of the differential amplifiers enable many such stages to be cascaded together, without compromising the clock rate, nor the analog input frequency. Hence, because settling can occur within a short period of time, the clock rate of the switched capacitor filter can be maintained at a high rate, and the input analog frequency can also be maintained at a relatively high rate, while yet allowing each filter stage of the multistage filter a sufficient amount of time for settling.

Figure 2:
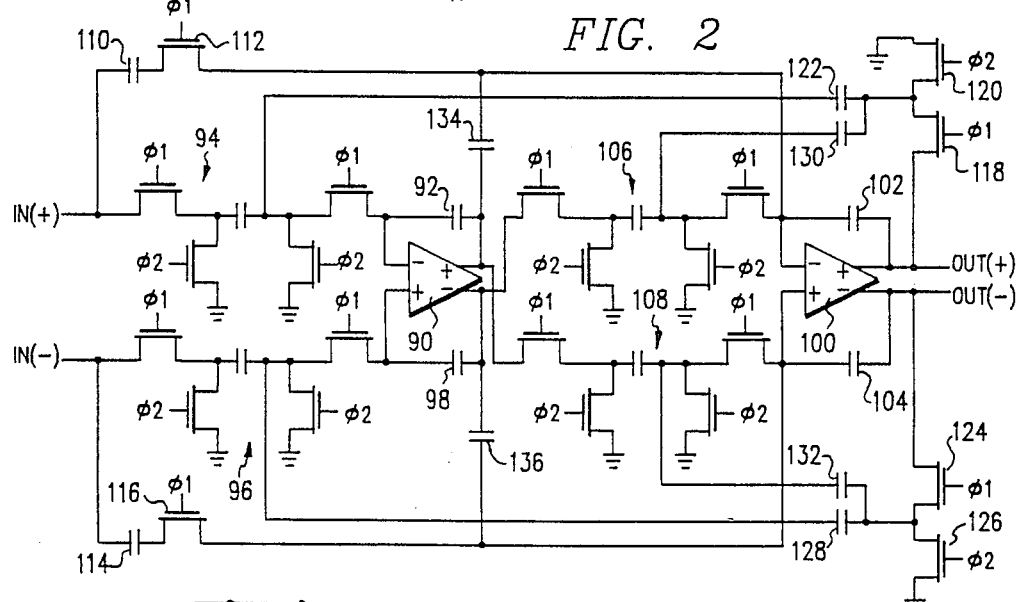
FIG. 2 is an electrical schematic drawing of a high-pass filter of the invention.

FIG. 2 illustrates a biquadratic switched capacitor filter for providing high-pass functions. The illustrated high-pass filter includes a differential input/output operational amplifier 90, a feedback capacitor 92, a first input switched capacitor network 94 connected to the stage input IN(+), and a second input switched capacitor network 96 connected to the IN(−) input of the filter stage. A second feedback capacitor 98 is the counterpart of feedback capacitor 92 for providing integrator functions. A second differential input/output operational amplifier 100 of the high-pass filter also includes feedback capacitors 102 and 104 for providing integrator functions. The inverting input of amplifier 100 is connected to a switched capacitor network 106 while the noninverting input thereof is connected to a similar switched capacitor network 108. As with the equalizer filter described above, the differential outputs of the integrator amplifier 90 are crossed, such that the inverting output thereof drives the switched capacitor network 106 and the noninverting output drives the switched capacitor network 108 associated with integrator amplifier 100. Negative capacitor characteristics can thus be realized.

A feedforward switched capacitor arrangement, similar to that described above, comprises a feedforward capacitor 110 and a series transistor switch 112. Feedforward capacitor 114 and transistor switch 116 provide counterpart functions. Provided also with the high-pass filter are transistor switches 118 and 120 driven by respective phases $\phi 1$ and $\phi 2$ for connecting capacitor 122 to the stage output OUT(+), or to ground, respectively. Transistor switches 124 and 126 operate in a comparable manner with respect to capacitor 128. According to the circuit topology of the FIG. 2 filter, capacitors 130 and 132 are provided to enhance the high-pass filters functions.

In accordance with another feature of the invention, the crossed differential outputs of amplifier 90 effect the high-pass filter capabilities of the biquadratic filter by shifting the pole and zero characteristics thereof. As a result, it has been found that with the addition of unity value capacitors 134 and 136, the high-pass filter characteristics are enhanced. Capacitor 134 is connected between the noninverting output of integrator amplifier 90 and the inverting input of integrator amplifier 100. Hence, capacitor 134 provides a summing effect, in that the analog signal currents passed through capacitors 110 and 134 are summed and input to amplifier 100. In this regard, capacitor 134 provides a feedforward effect, and thereby shifts the pole and zero characteristics of the filter. Unity value capacitor 136 functions in a comparable manner.

As noted above, by maintaining a bandwidth of the integrator amplifiers no wider then necessary, the noise figure thereof is optimized. In constructing switched capacitor filters with an emphasis on low noise, it is necessary to maintain the bandwidth of the amplifiers as low as permitted. To that end, the bandwidth of each integrator amplifier is tailored to exhibit a bandwidth no wider than necessary, and thereby enhance the noise figure of the filter stages. Primarily, it is desirable to provide a uniform capacitive loading to each integrator amplifier of the filter during both clock phases $\phi 1$ and $\phi 2$. In other words, while the capacitive loading of each integrator amplifier need not be the same, the capacitive loading should be somewhat uniform, as to each amplifier, during the clock phases.

Figure 4:
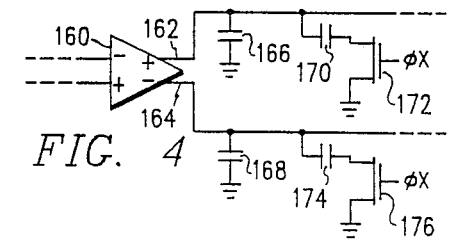
FIGS. 3 and 4 are electrical schematic drawings or circuits for correcting capacitive load imbalances.
Figure 3:
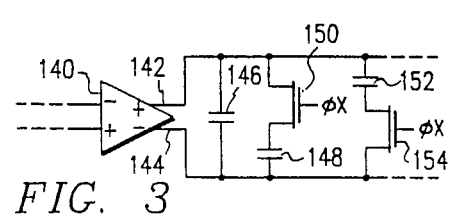

FIGS. 3 and 4 illustrate techniques for loading switched capacitor filter amplifiers during desired clock phases. Such a technique is especially useful in amplifiers of the type being output compensated. With reference to FIG. 3, there is illustrated an exemplary switched capacitor filter amplifier 140 having differential outputs 142 and 144 between which are connected a fixed capacitor 146 and a pair of switched capacitors. Switched capacitor 148 is connected in series with transistor switch 150, the combination of which is connected between the differential amplifier outputs 142 and 144. In like manner, but connected in a reversed manner, capacitor 152 and transistor switch 154 are connected in series between the differential outputs 142 and 144. The phase during which capacitive loading is less, is connected to transistor switches 150 and 154. In this manner, while such phase is occurring, transistor switches 150 and 154 will be driven in conduction and thereby connect capacitors 148 and 152 in parallel across the differential outputs 142 and 144 of amplifier 140. The fixed capacitor 146 provides the minimum desired bandwidth for the most heavily loaded clock phase, which also represents loading for the least capacitively loaded clock phase.

To provide symmetrical capacitive loading to the amplifier 140, capacitors 148 and 152 are calculated to be about one-half the total switched capacitance required, when added to the capacitance of fixed capacitor 146, to provide the desired loading associated with the phase $\phi_x$. The capacitive loading technique of FIG. 3 is especially useful where the differential outputs 142 and 144 of the amplifier 140 are close together on the silicon substrate and can thereby be bridged with the noted capacitors and transistors switches.

On the other hand, FIG. 4 is illustrative of a technique for providing capacitive loading when the outputs of the amplifier, such as amplifier 160, diverge and are not physically close together at a convenient location on the silicon substrate. In this embodiment, equal value, fixed capacitors 166 and 168 are connected between the respective amplifier differential outputs 162 and 164, and ground. Capacitors 166 and 168 would normally be twice the value as the comparable capacitor 146 of FIG. 3. A switched capacitor 170 is connected in series with a transistor switch 172 between amplifier output 162 and ground. Similarly, capacitor 174 and transistor switch 176 are connected in series between ground and the output 164 of amplifier 160. Capacitors 170 and 174 are each about four times the value required for the switched capacitors illustrated in FIG. 3. As noted above, each integrator amplifier can be capacitively loaded by one of the noted techniques, and each can be loaded with different capacitor values. Capacitors other than combinations of unity value capacitors can be employed to tailor the loading to exact values. The utilization of the capacitive loading techniques of FIG. 3 and FIG. 4 permit a more uniform loading of the amplifiers during the two switching phases, and thus provide a uniform and minimum desirable bandwidth. As a result, the noise generated by the amplifiers is reduced, thereby reducing the overall noise figure of the biquadratic filter stages.

From the foregoing, an improved method and apparatus is disclosed for providing biquadratic filters having improved performance. The provision of switched feedforward capacitors, together with a negative capacitance provision, facilitates the cascading of a large number of stages together, while yet being able to alternately clock such stages so that one stage settles while alternate stages are in a sampling phase. The technical advantage of this feature is the realization of negative capacitances, as noted, as well as the cascading of a number of stages to provide a flat overall response.

An additional technical advantage presented by the invention is the provision of differential input/output amplifiers with crossed outputs to provide an electrical inversion effect, without resort to additional or complicated circuits, such as the "ring of three" technique. A subsidiary technical advantage presented by this feature is that the clock phases need not be rearranged within each filter stage. Yet another technical advantage of this feature, and as especially employed in high-pass filters, is the provision of an additional feedforward capacitor, the value of which can be selected to effectively move the pole and zero response to desired locations.

A further technical advantage of the invention is the balanced capacitive load on each integrator amplifier of the filter during each clock phase. In realizing this technical advantage, switched capacitors are placed on the differential output of the amplifiers, and switched during the phase requiring the additional capacitance. One advantage of this feature is that by capacitively loading the amplifiers, a desired bandwidth can be obtained, thereby controlling the noise factor of the amplifier, and thus of the filter.

While the preferred embodiment of the invention has been disclosed with reference to a specific filter apparatus and method, it is to be understood that many changes in detail may be made as a matter of engineering choices without departing from the spirit and scope of the invention, as defined by the appended claims.

What is claimed is:

1. A switched capacitor filter, comprising:
    a pair of series-connected integrators each having at least one input terminal, one of said input terminals having a switched capacitor input network connected thereto;
    a feedforward switched capacitor circuit for coupling a signal from an input of one said integrator input network to an input terminal of the other integrator; and
    a nonoverlapping biphase clock for driving said switched capacitor input networks during one phase for sampling an input signal and during another phase for settling of said filter, said clock being connected to said switched capacitor networks for causing said integrators to simultaneously sample and simultaneously settle toward a steady state value during said respective different clock phases, said clock being connected to said feedforward switched capacitor circuit to switch in said feedforward capacitor during said one phase and switch out said feedforward capacitor during said other phase, wherein said integrators each comprise a differential input/output integrator amplifier.

2. The switched capacitor filter of claim 1, wherein said feedforward switched capacitor circuit is connected to said one clock phase to allow a signal to be coupled through said switched capacitor networks.

3. The switched capacitor filter of claim 1, further including a capacitor connected to said feedforward switched capacitor circuit and to an output of one said integrator to provide a desired high-pass characteristic to said filter.

4. The switched capacitor filter of claim 1, further including one said switched capacitor input network connected to each input terminal of each said integrator amplifier.

5. The switched capacitor filter of claim 4, wherein each said switched capacitor input network comprises a pair of transistor switches connected in series with a capacitor, and a pair of transistor switches connected to shunt both sides of said capacitor to ground.

6. The switched capacitor filter of claim 5, wherein said series transistor switches are driven by one said clock phase and said shunt transistor switches are driven by another said clock phase.

7. The switched capacitor filter of claim 6, wherein substantially identical said switched capacitor networks are connected to each differential input of each said integrator amplifier.

8. The switched capacitor filter of claim 1, wherein one said differential integrator amplifier is connected to a switched capacitor input network of said other integrator differential amplifier in a manner as to produce a negative capacitance effect.

9. A switched capacitor filter, comprising:
    a pair of series-connected integrators each having at least one input terminal, one of said input terminals having a switched capacitor input network connected thereto;
    a feedforward switched capacitor circuit for coupling a signal form an input of one said integrator input network to an input terminal of the other integrator; and
    a nonoverlapping biphase clock for driving said switched capacitor input network during one phase for sampling an input signal and during another phase for settling of said filter, said clock being connected to said switched capacitor networks for causing said integrators to simultaneously sample and simultaneously settle toward a steady state value during said respective different clock phases, said clock being connected to said feedforward switched capacitor circuit to switch in said feedforward capacitor during said one phase and switch out said feedforward capacitor during said another phase,
    said integrators each comprising a differential input/output integrator amplifier,
    each said differential amplifier including a differential output comprising an inverting and a noninverting output, said inverting output of one said integrator amplifier driving the switched capacitor input network associated with an inverting input of said another integrator amplifier, and wherein the noninverting differential output of one said integrator amplifier drives a switched capacitor input network associated with a noninverting input of said another integrator amplifier.

10. A method for fabricating a switched capacitor filter, comprising the steps of:
    connecting in series a pair of integrators having at least one input terminal, one of said input terminals having a switched capacitor input network connected thereto;
    connecting a feedforward switched capacitor circuit for coupling a signal from an input of one said integrator input network to an input terminal of the other integrator;
    connecting a nonoverlapping biphase clock to said filter for driving said switched capacitor input networks during one phase for sampling an input signal and during another phase for settling of said filter, said clock being connected to said switched capacitor networks for causing said integrators to simultaneously sample and simultaneously settle toward a steady state value during said respective different clock phases, said clock being connected to said feedforward switched capacitor circuit to switch in said feedforward capacitor during said one phase and switch out said feedforward capacitor during said other phase; and
    connecting said integrators together using switched capacitor networks to achieve a negative capacitance,
    each said integrator includes a differential amplifier with a differential output comprising an inverting and a noninverting output, and further including connecting said inverting output of one said integrator amplifier so as to drive a switched capacitor input network associated with an inverting input of said other integrator amplifier, and connecting the noninverting differential output of one said integrator amplifier so as to drive a switched capacitor input network associated with a noninverting input of said other integrator amplifier.

11. A method for fabricating a switched capacitor filter network comprising:
a plurality of individual filters connected together to provide an overall filter function, each said individual filter formed by the steps of,
connecting in series a pair of integrators having at least one input terminal, one of said input terminals having a switched capacitor input network connected thereto;
connecting a feedforward switched capacitor circuit for coupling a signal from an input of one said integrator input network to an input terminal of the other integrator;
connecting a nonoverlapping biphase clock to said filter for driving said switched capacitor input networks during one phase for sampling an input signal and during another phase for settling of said filter, said clock being connected to said switched capacitor networks for causing said integrators to simultaneously sample and simultaneously settle toward a steady state value during said respective different clock phases, said clock being connected to said feedforward switched capacitor circuit to switch in said feedforward capacitor during said one phase and switch out said feedforward capacitor during said another phase; and
connecting said filter to an analog interface circuit for processing input analog signals to said switched capacitor network to provide output digital signals.

12. A switched capacitor filter, comprising:
a pair of series-connected integrators each having at least one input terminal, one of said input terminals having a switched capacitor input network connected thereto;
a feedforward switched capacitor circuit for coupling a signal from an input of one said integrator input network to an input terminal of the other integrator;
a nonoverlapping biphase clock for driving said switched capacitor input networks during one phase for sampling an input signal and during another phase for settling of said filter, said clock being connected to said switched capacitor networks for causing said integrators to simultaneously sample and simultaneously settle toward a steady state value during said respective different clock phases, said clock being connected to said feedforward switched capacitor circuit to switch in said feedforward capacitor during said one phase and switch out said feedforward capacitor during said other phase; and
a capacitive load connected to the output of at least one said integrator for reducing the bandwidth thereof.

13. The switched capacitor filter of claim 12, wherein said loading capacitor is switched with a transistor switch during one phase of said clock.

14. The switched capacitor filter of claim 12, wherein said integrators each include an amplifier, and wherein at least one of said capacitive load is a fixed capacitor connected to said one amplifier output for providing a capacitive loading thereto during both said clock phases, and further including a switched capacitor connected to at least one said amplifier output for providing an additional load thereto during one said clock phase.

15. A switched capacitor filter, comprising:
a pair of series-connected integrator amplifiers having first input terminals, each first input terminal having a switched capacitor input network connected thereto;
a feedforward switched capacitor circuit for coupling a signal from an input of one said integrator input network to an input terminal of said another said integrator;
a feedwork capacitor connected between an output of one said amplifier and an input of said another said amplifier for providing a composite signal having components of said amplifier output and of said feedforward switched capacitor circuit to provide an effective summation thereof provided to the input of said another amplifier; and
a nonoverlapping biphase clock for driving said switched capacitor input networks during one phase for sampling and during another phase for settling of said filter, said clock being connected to said switched capacitor networks for causing said integrator amplifiers to simultaneously sample and simultaneously settle toward a steady state value during said respective different clock phases, said clock being connected to said feedforward switched capacitor circuit to switch in said feedforward capacitor during said one phase and switch out said feedforward capacitor during the other phase, wherein said filter comprises a high-pass filter, and a capacitance value of said feedforward capacitor establishes a pole-zero position of a transfer function characteristic of said filter.

16. A switched capacitor filter network comprising:
a plurality of switched capacitor filters connected together to provide an overall filter function, each filter including,
a pair of series-connected integrators each having at least one input terminal, one of said input terminals having a switched capacitor input network connected thereto;
a feedforward switched capacitor circuit for coupling a signal from an input of one said integrator input network to an input terminal of the other integrator; and
a nonoverlapping biphase clock for driving said switched capacitor input networks during one phase for sampling an input signal and during another phase for settling of said filter, said clock being connected to said switched capacitor networks for causing said integrators to simultaneously sample and simultaneously settle toward a steady state value during said respective different clock phases, said clock being connected to said feedforward switched capacitor circuit to switch in said feedforward capacitor during said one phase and switch out said feedforward capacitor during said other phase; and
analog interface circuits for processing input analog signals to said switch capacitor network to provide output digital signals.

17. The switched capacitor filter of claim 16, wherein at least one of said switched capacitor filters operates to provide an equalization function, and at least one of said switched capacitor filters operates for providing a high-pass function.

18. A method for fabricating a switched capacitor filter, comprising the steps of:

connecting in series a pair of integrators having at least one input terminal, one of said input terminals having a switched capacitor input network connected thereto;

connecting a feedforward switched capacitor circuit for coupling a signal from an input of one said integrator input network to an input terminal of the other integrator;

connecting a nonoverlapping biphase clock to said filter for driving said switched capacitor input networks during one phase for sampling an input signal and during another phase for settling of said filter, said clock being connected to said switched capacitor networks for causing said integrators to simultaneously sample and simultaneously settle toward a steady state value during said respective different clock phases, said clock being connected to said feedforward switched capacitor circuit to switch in said feedforward capacitor during said one phase and switch out said feedforward capacitor during said another phase; and connecting a capacitive load to the output of at least one said integrator for reducing the bandwidth thereof.

19. The method of claim 18, further including switching said load capacitor with a transistor switch during one phase of said clock.

20. The method of claim 18, wherein said integrators each include an amplifier, and further including fixing a capacitor to said one amplifier output for providing a capacitive loading thereto during both said clock phases, and switching capacitor for providing an additional load thereto during one said clock phase.

21. A biquadratic switched capacitor filter, comprising:

a pair of differential input/output amplifiers, and having respective capacitors connected thereto to provide integrator functions with respect to each said amplifier;

a switched capacitor network connected to each differential input of each said amplifier, each said switched capacitor network comprising a pair of transistor switches connected in series with a capacitor, and a pair of transistor switches connected to said capacitor for grounding said capacitor;

a biphase nonoverlapping clock, one phase thereof for driving said series transistor switches of each said switched capacitor network, and the other phase thereof for driving said transistor switches for grounding said capacitor; and a pair of switched feedforward capacitors, each connected between a differential input of one said integrator amplifier and a differential input of the other said integrator amplifier, said switched feedforward capacitor comprising a capacitor connected in series with a transistor switch, said switch being driven by the clock phase which also drives said series-connected transistor switches of said switched capacitor networks.

22. The switched capacitor filter of claim 21, further including means for balancing a capacitive load of at least one said integrator amplifier connected thereto during said clock phases.

23. The biquadratic switched capacitor filter of claim 21, wherein said filter is fabricated in integrated circuit form having analog circuits and digital circuits.

24. A method for controlling the bandwidth of amplifiers employed in a switched capacitor filter, said amplifiers having output terminals, comprising the steps of:

switchably connecting a capacitor between output terminals of said amplifier such that in one switch position said capacitor adds a desired capacitive loading to said amplifier to reduce the bandwidth and connected such that in another switch position said capacitor load is removed without said capacitor being discharged to ground; and switching said capacitor during one phase of a biphase clock so as to provide additional capacitive loading to said amplifier during said switched phase and thereby reduce the bandwidth thereof.

25. The method of claim 24, further including connecting a fixed capacitor to said amplifier output terminals.

26. The method of claim 24, wherein said amplifier has differential outputs and further including switching said capacitor so as to provide a capacitive loading between said differential outputs of said amplifier.

27. The method of claim 24, further including connecting said capacitor having about half said desired value to said amplifier output, and switchably connecting another substantially similar valued capacitor to said amplifier output and switching said similar valued capacitor in phase with the switching of said capacitor.

* * * * *